United States Patent
Snowdon (10) Patent No.: US 10,230,356 B2
(45) Date of Patent: Mar. 12, 2019

(54) HIGH-SIDE OUTPUT TRANSISTOR CIRCUIT

(71) Applicant: Allegro MicroSystems, LLC, Manchester, NH (US)

(72) Inventor: Kenneth Snowdon, Stratham, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/890,563

(22) Filed: Feb. 7, 2018

(65) Prior Publication Data

US 2018/0248539 A1 Aug. 30, 2018

Related U.S. Application Data

(60) Provisional application No. 62/463,930, filed on Feb. 27, 2017.

(51) Int. Cl.
| | |
|---|---|
| *H03K 3/012* | (2006.01) |
| *H03K 17/687* | (2006.01) |
| *H03K 17/16* | (2006.01) |
| *H03K 17/082* | (2006.01) |
| *H02M 1/08* | (2006.01) |
| *H02M 3/155* | (2006.01) |

(52) U.S. Cl.
CPC .............. *H03K 3/012* (2013.01); *H02M 1/08* (2013.01); *H03K 17/0822* (2013.01); *H03K 17/165* (2013.01); *H03K 17/687* (2013.01); *H02M 3/155* (2013.01); *H03K 2217/0063* (2013.01)

(58) Field of Classification Search
CPC ...................................................... H03K 3/012
See application file for complete search history.

(56) References Cited

U.S. PATENT DOCUMENTS

| | | | |
|---|---|---|---|
| 4,904,909 A | 2/1990 | Zeeland et al. | |
| 5,001,373 A | 3/1991 | Bator et al. | |
| 5,051,610 A * | 9/1991 | Terane | H03K 3/037 |
| | | | 327/210 |
| 5,790,396 A | 8/1998 | Miyazaki et al. | |
| 5,917,359 A | 6/1999 | Fukunaga et al. | |
| (Continued) | | | |

FOREIGN PATENT DOCUMENTS

| | | |
|---|---|---|
| GB | 2 244 400 A | 11/1991 |
| JP | 2000-077537 A | 3/2000 |
| (Continued) | | |

OTHER PUBLICATIONS

Allegro MicroSystems, Inc. Data Sheet; "A4933 Automotive 3-Phase MOSFET Driver;" Dec. 1, 2010; 25 pages.

(Continued)

*Primary Examiner* — Daniel C Puentes
(74) *Attorney, Agent, or Firm* — Daly, Crowley, Mofford & Durkee, LLP (57) ABSTRACT

A high voltage driver includes a high-side output transistor circuit, a differential to single-ended (D2SE) converter connected to a gate of the high-side output transistor circuit, wherein the D2SE is supplied by a first and a second supply voltage, and a high voltage translator connected to the D2SE converter. The D2SE converter and the translator circuit are used to clamp a voltage at the gate of the high-side transistor circuit to be the first supply voltage less the second supply voltage.

16 Claims, 4 Drawing Sheets

(56) References Cited

U.S. PATENT DOCUMENTS

| | | | |
|---|---|---|---|
| 6,014,049 | A | 1/2000 | Bach et al. |
| 6,058,031 | A | 5/2000 | Lyons et al. |
| 6,385,028 | B1 | 5/2002 | Kouno |
| 6,611,154 | B2 | 8/2003 | Grasso et al. |
| 6,809,553 | B2 | 10/2004 | Morini et al. |
| 6,897,706 | B2 | 5/2005 | Coutu |
| 7,212,033 | B2 | 5/2007 | Subramania et al. |
| 7,327,546 | B2 | 2/2008 | Thiery |
| 8,044,699 | B1 | 10/2011 | Kelly |
| 8,390,341 | B2 | 3/2013 | Sugie |
| 8,633,745 | B1 | 1/2014 | Peterson |
| 8,970,265 | B2 | 3/2015 | McIntosh et al. |
| 9,537,383 | B1 | 1/2017 | Wibben |
| 2006/0087363 | A1 | 4/2006 | Galbiati |
| 2007/0182386 | A1 | 8/2007 | Garner |
| 2008/0042595 | A1 | 2/2008 | Ribarich |
| 2008/0192390 | A1 | 8/2008 | Yoshida |
| 2008/0246518 | A1 | 10/2008 | Galvano |
| 2008/0284357 | A1 | 11/2008 | Ribarich |
| 2008/0290853 | A1 | 11/2008 | Ito |
| 2009/0256617 | A1 | 10/2009 | Ochi |
| 2010/0026361 | A1 | 2/2010 | Jung et al. |
| 2010/0123478 | A1 | 5/2010 | Osaka |
| 2012/0013323 | A1 | 1/2012 | Kenney |
| 2012/0154007 | A1 | 6/2012 | Imanishi et al. |
| 2013/0009674 | A1 | 1/2013 | Reese et al. |
| 2016/0056818 | A1* | 2/2016 | Kanda ............... H03K 17/6872 318/504 |

FOREIGN PATENT DOCUMENTS

| | | |
|---|---|---|
| JP | 2001-358567 A | 12/2001 |
| JP | 2003-032102 A | 1/2003 |
| JP | 2003-179482 A | 6/2003 |
| JP | 2010-124046 A | 6/2010 |
| JP | 2010-124049 A | 6/2010 |
| JP | 2010-199406 A | 9/2010 |
| JP | 2012-129973 A | 7/2012 |
| JP | 2012-130209 A | 7/2012 |
| WO | WO 02/43236 A2 | 5/2002 |
| WO | WO 03/019780 A1 | 3/2003 |
| WO | WO 2003/055072 A1 | 7/2003 |

OTHER PUBLICATIONS

Allegro MicroSystems, LLC; annotated schematic diagram representative of Allegro Part No. A-4933; Dec. 1. 2010; 1 page.

Allowance Decision and IPO Examination Report dated Aug. 31, 2015 for Taiwan Appl. No. 103105462; 4 pages.

Japanese Notice of Allowance dated Nov. 13, 2017 for Japanese Application No. 2015-529835; 11 pages.

Japanese Office Action dated Apr. 19, 2017 for Japanese Application No. 2015-529835; 9 pages.

Japanese Office Action dated Jan. 25, 2018 for Japanese Application No. 2016-500233; 13 pages.

Notice of Allowance dated Jun. 10, 2013 for U.S. Appl. No. 13/599,211; 8 pages.

Notice of Allowance dated Oct. 28, 2014 for U.S. Appl. No. 13/827,074; 7 pages.

PCT International Search Report and Written Opinion of the ISA dated Dec. 3, 2013; for International Pat. App. No. PCT/US2013/054603; 15 pages.

PCT International Search Report and Written Opinion of the ISA dated Sep. 24, 2014; for PCT Pat. App. No. PCT/US2014/015701; 17 pages.

Response to European Communication dated Mar. 13, 2015 for European Application No. 13753940.9; Response filed Sep. 22, 2015; 16 pages.

Response to Japanese Office Action dated Apr. 19, 2017 for Japanese Application No. 2015-529835; Response filed Jun. 14, 2017; 19 pages.

Response to Japanese Office Action dated Jan. 25, 2018; Response filed Apr. 24, 2018 for Japanese Application No. 2016-500233; 11 pages.

Response to U.S. Non-Final Office Action dated Jun. 26, 2014 for U.S. Appl. No. 13/827,074; Response filed Sep. 22, 2014; 11 pages.

Texas Instruments; "UC2625-EP SLU802 Brushless DC Motor Controller;" Production Data Information; Mar. 2008; 25 pages.

Toshiba; TB9061FNG 3-Phase Sensorless Brushless Motor Pre-driver; Toshiba Data Sheet; http://www.datasheets.com/search/partdetail/TB9061FNG/Toshibal; Dec. 13, 2011; 7 pages.

U.S. Non-Final Office Action dated Jun. 26, 2014 for U.S. Appl. No. 13/827,074; 8 pages.

Unitrode Data Sheet; "UC1725 Isolated High Side FET Driver;" Jan. 1999; 7 pages.

Japanese Notice of Allowance (with English allowed claims) dated May 30, 2018 for Japanese Application No. 2016-500233; 7 pages.

Korean Voluntary Amendment (with English claims) filed Oct. 2, 2018 for Korean Application No. 10-2015-7028400; 21 pages.

Communication pursuant to Article 94(3) EPC dated Sep. 19, 2018 for Application No. 13753940.9; 7 Pages.

21$^{st}$, Century Patent & Law Firm reporting letter dated Jan. 10, 2019 for KR Pat. Appl. No. 10-2015-7007897; 2 pages.

KR Notice of Allowance English translation dated Jan. 4, 2019 for KR Pat. Appl. No. 10-2015-7007897; 1 page.

KR Allowed Claims from KR Notice of Allowance dated Jan. 4, 2019 for KR Pat. Appl. No. 10-201-7007897; 11 pages.

* cited by examiner

HIGH-SIDE OUTPUT TRANSISTOR CIRCUIT

CROSS REFERENCE TO RELATED APPLICATIONS

The present application claims the benefit of U.S. Provisional Patent Application No. 62/463,930, filed on Feb. 27, 2017, which is incorporated herein by reference.

STATEMENT REGARDING FEDERALLY SPONSORED RESEARCH

Not Applicable.

FIELD

This disclosure relates generally to control circuits, and more particularly, to adaptive compensation for digitally controlled voltage mode DC-DC converters.

BACKGROUND

Generally, high voltage drivers include a high-side circuit and a low-side circuit. In one example, the high-side circuit is a PMOS transistor. In some particular examples, a PMOS transistor includes a gate (with a thin oxide (e.g., 150 nm) that is susceptible to gate oxide over stress from, for example, too much voltage applied to the gate.

SUMMARY

According to the disclosure, a high voltage driver includes a high-side output transistor circuit, a differential to single-ended (D2SE) converter connected to a gate of the high-side output transistor circuit, wherein the D2SE is supplied by a first and a second supply voltage, and a high voltage translator connected to the D2SE converter, wherein the D2SE converter and the translator circuit are used to clamp a voltage at the gate of the high-side transistor circuit to be the first supply voltage less the second supply voltage.

Features may include one or more of the following individually or in combination with other features. The high-side output transistor circuit may include a p-type device, which p-type device may include a p-channel DMOS high voltage (HV) transistor and/or a PMOS transistor. The high voltage translator may include an NMOS transistor pair configured to switch the high voltage translator, a first PMOS transistor pair configured to latch feedback signals from the NMOS transistor pair, and a second PMOS transistor pair configured to clamp the voltage at the gate. In embodiments, the voltage at the gate is not reduced by a threshold voltage from the first PMOS transistor pair. The high voltage driver may further include a resistor disposed between the first and second supply voltage. The D2SE converter may include four PMOS transistors and four NMOS transistors. The high voltage translator may include a NMOS transistor pair configured to switch the high voltage translator, a first PMOS transistor pair configured to latch feedback signals from the NMOS transistor pair, and a second PMOS transistor pair configured to clamp the voltage at the gate. In embodiments, the voltage at the gate is not reduced by a threshold voltage from the first PMOS transistor pair.

Also described is an integrated circuit (IC), including a high voltage driver including a high-side output transistor circuit, a differential to single-ended (D2SE) converter connected to a gate of the high-side output transistor circuit, wherein the D2SE is supplied by a first and a second supply voltage, and a high voltage translator connected to the D2SE converter. The D2SE converter and the translator circuit may be used to clamp a voltage at the gate of the high-side transistor circuit to be the first supply voltage less the second supply voltage. Features may include one or more of the following individually or in combination with other features. The high-side output transistor circuit may include a p-type device, which p-type device may include a p-channel DMOS high voltage (HV) transistor and/or a PMOS transistor. In embodiments, a resistor may be disposed between the first and second supply voltage. The D2SE converter comprises four PMOS transistors and four NMOS transistors.

DETAILED DESCRIPTION

Described herein are techniques to fabricate a high voltage driver that includes a high-side output circuit. In one example, the high voltage driver includes a translation circuit coupled to a differential to single-ended (D2SE) converter that is coupled to a gate of a high-side output transistor driver. In one example, the techniques described herein allows a high-side output transistor (e.g., a PMOS transistor, a p-channel DMOS high voltage (HV) transistor or other p-type device) to operate within a safe operating voltage (i.e., there is no gate oxide over stress from, for example, too much voltage applied to the gate). In another example, the techniques described herein maximizes the high-side output transistor gate voltage by allowing a higher over-drive to the output transistor than traditional techniques. In a further example, the techniques described herein provides a mechanism to eliminate inverter threshold current and a buffering stage to the high-side output transistor. In a still further example, the techniques described herein teach a method to protect the low voltage transistors of the high-side PMOS driver during power off conditions.

Further the techniques described herein ensure that there are no crowbar currents. For example, a crowbar current is an undesired current from the positive supply to the negative supply as a result of a PMOS and NMOS transistor stack being simultaneously on at the same time.

Figure 1:
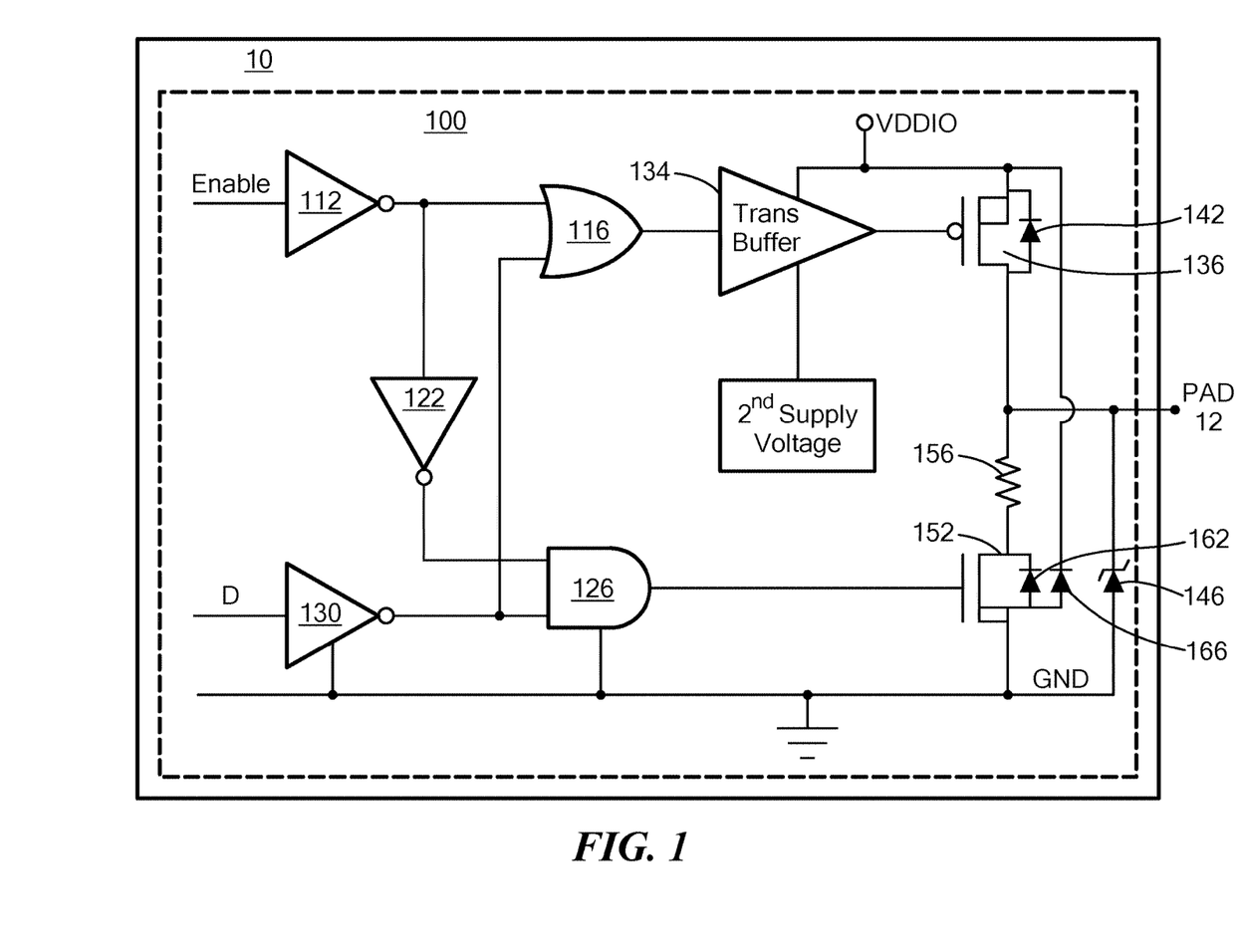
FIG. 1 is a block diagram of an example of an integrated circuit that includes a circuit diagram of an example of a high voltage output driver.

Referring to FIG. 1, an integrated circuit (IC) 10 includes a high voltage output driver 100 that includes an output port, a pad 12. In one example, the high voltage output driver 100 includes inverters 112, 122, 130, an OR gate 116, an AND gate 126, a translating buffer 134, a high-side PMOS transistor 136, a low-side NMOS transistor 152, Zener diode 146, diodes 166 and a resistor 156.

The inverter 112 received a first signal, Enable, and the inverter 130 receives a second input signal, D. The OR gate 116 receives an input from the inverter 112 and the inverter 130. The AND gate 126 receives inputs from the inverter 122 and the inverter 130. The translating buffer 134 receives an input from the OR gate 116 and provides an output to the gate of the PMOS transistor 136.

The PMOS transistor 136 has its source tied to a first supply voltage, VDDIO, and its drain connected to the pad 12 and the resistor 156. The PMOS transistor 136 includes a parasitic diode 142 (or P+/NWELL diode) connected in parallel with the source and drain of the PMOS transistor 136.

The NMOS transistor 152 has its source tied to ground and its drain connected to the resistor 156. The NMOS transistor 152 includes a parasitic diode 162 (or is a PWELL/ N+ diode) that is connected in parallel with the source and the drain of the NMOS transistor 152. The diode 166 (or PWELL/NISO diode) is connected in parallel with the supply voltage, VDDIO, and the source of the NMOS transistor 152. The Zener diode 146 is connected to the pad 12 and ground and provides electrostatic discharge (ESD) protection.

The translating buffer 134 receives the first supply voltage and a second supply voltage (or buffer reference). In one example, the second supply voltage is equal to VDDIO−3.3 V.

Figure 2:
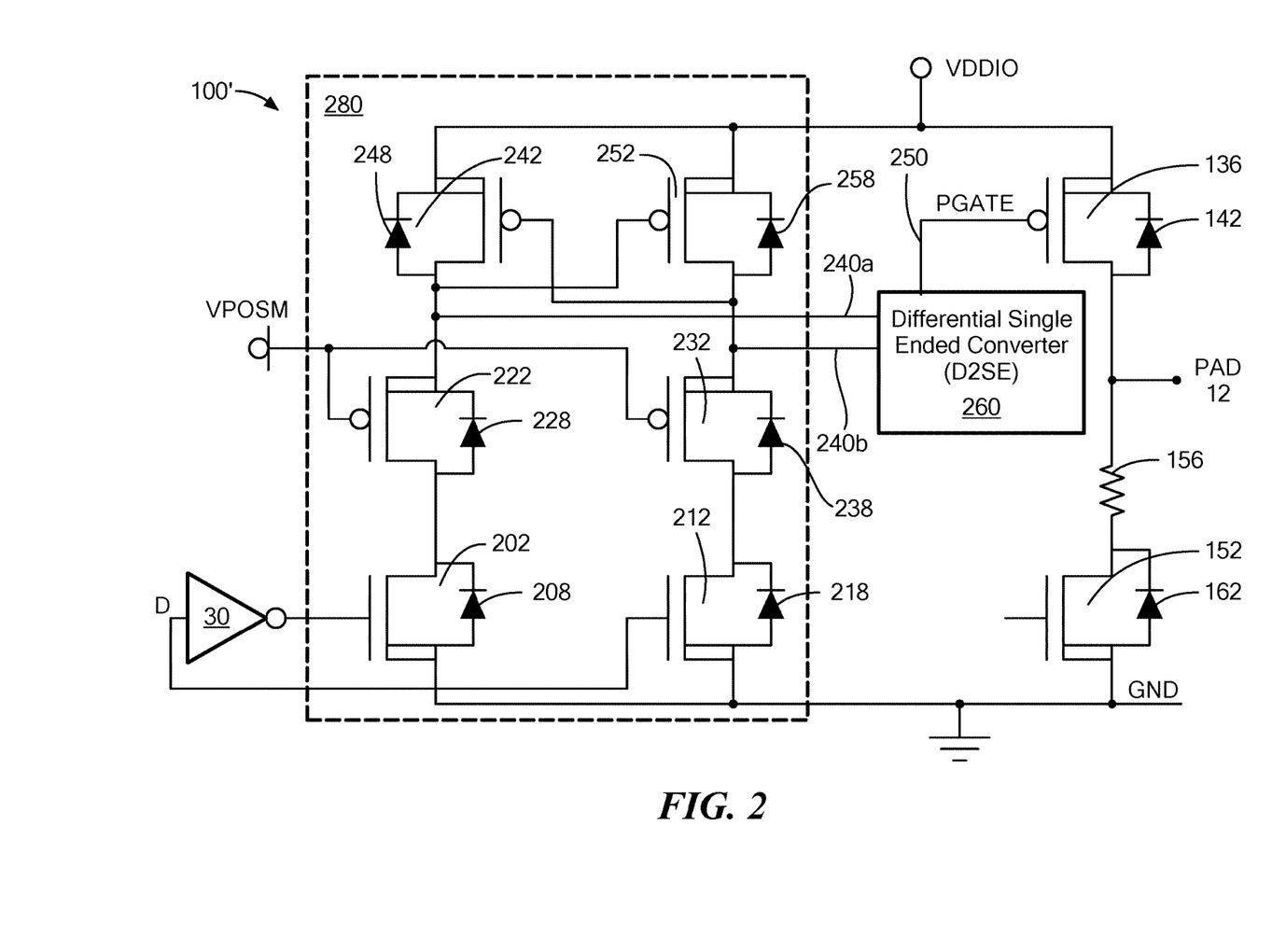
FIG. 2 is an abbreviated circuit diagram of another example of the high voltage output driver.

Referring to FIG. 2, a circuit 100' is an abbreviated circuit of the high voltage output driver 100. The circuit 100' includes a high voltage translator 280 coupled to a differential to single-ended (D2SE) converter 260 by a connection 240a and a connection 240b. The D2SE converter is coupled to the gate of the PMOS 136 by a connection 250.

The high voltage translator 280 includes NMOS transistors 202, 212 and PMOS transistors 222, 232, 242, 252. The NMOS transistors 202, 212 serve as a switch for the high voltage translator 280. The PMOS transistor 222, 232 are used as clamping transistors to clamp the voltage to the gate of the PMOS transistor 136 and the gates of the PMOS transistors 242, 252. The PMOS transistors 242, 252 are latching feedback transistors that latch the signals from the NMOS transistors 202, 212.

The PMOS transistor 228 includes a—diode 228 connected in parallel with the source and the drain and the PMOS transistor 232 includes a diode 238 connected in parallel with the source and the drain. The gates of the PMOS transistors 314, 316 are connected to a second supply voltage, VPOSM. In one example, the second supply voltage follows the first supply voltage. In one example, VPOSM=VDDIO−3.3V. The source of PMOS 222 is connected to the drain of PMOS 242 and the source of PMOS 232 is connected to the drain of PMOS 252. The drain of PMOS 222 is connected to the drain of NMOS 202 and the drain of PMOS 232 is connected to the drain of NMOS 212.

The sources of PMOS 242, 252 are connected to the first supply voltage, VDDIO. The gate of PMOS 242 is connected to the drain of PMOS 252 and the gate of PMOS 252 is connected to the drain of PMOS 242. The PMOS transistor 242 includes a parasitic diode 248 connected in parallel with the source and the drain and the PMOS transistor 252 includes a parasitic diode 258 connected in parallel with the source and the drain. The connection 240a is connected to the source of PMOS transistor 222 and the drain of PMOS transistor 242; and the connection 240b is connected to the source of PMOS transistor 232 and the drain of PMOS transistor 252.

The sources of NMOS transistors 202, 212 are connected to ground. The gate of the NMOS transistor 202 is connected to the output of the inverter 30 and the gate of the NMOS transistor 212 is connected to the second input signal, D. The NMOS transistor 202 includes a diode 208 connected in parallel with the source and the drain and the NMOS transistor 212 includes a diode 218 connected in parallel with the source and the drain.

The PMOS transistors 222, 232 are clamp transistors which function is to clamp the swing at their sources to a voltage determined by (VDDIO−(VPOSM+VT)), where VT is the threshold voltage of PMOS transistors 222, 232. In one example, if VDDIO=6V and VPOSM=VDDIO−3.3V, the clamped swing would be 3.3V−VT. If the VT of the PMOS was around 1.5V then the swing would only be about 1.8V, which is undesirable. For example, at cold temperatures with larger VT's the issue is even worse where incomplete switching of the PMOS transistor pair 242, 252 may occur.

Other issues with using high voltage translator transistors is that the drive to the gate cross-coupled PMOS transistor pair 242, 252 has additional capacitance due to the source and added resistance. As will be shown further herein, the D2SE converter 260 may be used to mitigate these issues.

Figure 3:
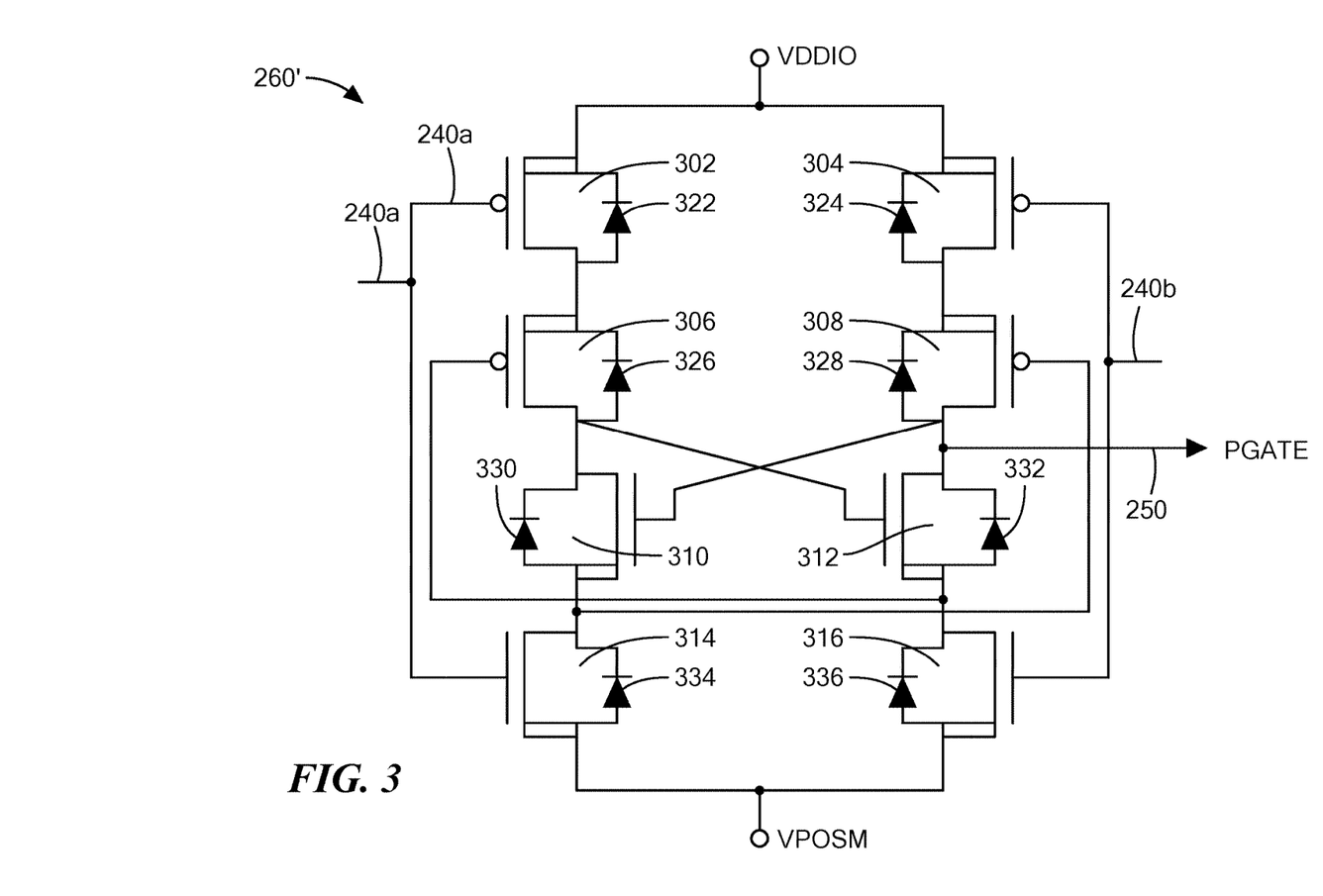
FIG. 3 is a circuit diagram of an example of a differential to single ended (D2SE) converter.

Referring to FIG. 3, an example of the D2SE converter 260 is a D2SE converter 260'. The D2SE converter 260' includes PMOS transistors 302, 304, 306 and 308 and NMOS transistors 310, 312, 314 and 316.

The connection 240a is connected to the gates of PMOS transistor 302 and NMOS transistor 314 and the connection 240b is connected to the gates of PMOS transistor 304 and NMOS transistor 316. The connection 250 is connected to the drains of PMOS transistor 308 and NMOS transistor 312.

The first supply voltage VDDIO is connected to the sources of PMOS transistors 302, 304. The second supply voltage VPOSM is connected to the sources of NMOS transistors 314, 316.

The drain of PMOS transistor 302 is connected to the source of PMOS transistor 306. The PMOS transistor 302 includes a diode 322 connected in parallel with the source and the drain.

The drain of PMOS transistor 304 is connected to the source of PMOS transistor 308. The PMOS transistor 304 includes a diode 324 connected in parallel with the source and the drain.

The drain of PMOS transistor 306 is connected to the drain of PMOS transistor 310. The gate of the PMOS transistor 306 is connected to the source of the NMOS transistor 312 and the drain of the NMOS transistor 316. The PMOS transistor 306 includes a diode 326 connected in parallel with the source and the drain.

The drain of PMOS transistor 308 is connected to the drain of PMOS transistor 312. The gate of the PMOS transistor 308 is connected to the source of the NMOS transistor 310 and the drain of the NMOS transistor 314. The PMOS transistor 308 includes a diode 328 connected in parallel with the source and the drain.

The source of NMOS transistor 310 is connected to the drain of the NMOS transistor 314. The gate of NMOS transistor 310 is connected to the drain of the PMOS transistor 308. The NMOS transistor 310 includes a diode 330 connected in parallel with the source and the drain.

The source of NMOS transistor 312 is connected to the drain of the NMOS transistor 316. The gate of NMOS transistor 312 is connected to the drain of the PMOS transistor 306. The NMOS transistor 312 includes a—diode 332 connected in parallel with the source and the drain.

The NMOS transistor 314 includes a—diode 334 connected in parallel with the source and the drain. The NMOS transistor 316 includes a diode 336 connected in parallel with the source and the drain.

The function of the D2SE converter 260' is to take the small swing differential signal at the sources of PMOS transistors 222, 232 and connect them to the input gates of the PMOS transistors 302, 304 and NMOS transistors 314, 316. When the gate of NMOS transistor 316 is pulled high, the drain of NMOS transistor 316 goes low also pulling low the gate of PMOS transistor 306. The drain of PMOS transistor 306 pulls up the gate of NMOS transistor 312, which switches the state of the cross-coupled NMOS transistor pair 310, 312. The series stack of transistors PMOS transistors 302, 306 and NMOS transistors 310, 314 allows for a cascade of transistor switching times so that there is never two transistors that are partially on at the same time. The cross-coupled NMOS transistor pair 310, 312 provide the latching mechanism needed to keep one stack of transistor (PMOS transistors 302, 306 and NMOS transistors 310, 314) high (low) and the other stack of transistors (PMOS transistors 304, 308 and NMOS transistors 312, 316) low (high).

With the D2SE converter, the gate voltage of the PMOS transistor 136 is clamped to VDDIO−VPOSM. In one example, the gate voltage of the PMOS transistor 136 is clamped to 3.3 V.

The input to the D2SE converter 260 is the swing of the PMOS transistors pair 242, 252 which has been reduced by VT. If the PMOS transistor pair 242, 252 drives the output PMOS directly 136 (without the D2SE converter 260'), the swing would be a reduced overdrive to the output. However, by using the D2SE converter 260' the output to the PMOS transistor 136 may be driven with a higher gate overdrive because it would be the full VDDIO−VPOSM swing.

When the inputs to the D2SE converter 260' are not at the rails, the current in the D2SE converter 260' is still zero. If an inverter has been used instead, there would still be a current because the input of the inverter would be at threshold. Therefore, this solution is lower power than any other buffered technique.

Referring back to FIGS. 2 and 3, the D2SE converter 260' ensures that there are no crowbar currents in the circuit 100'. For example, the high-side PMOS transistor 136 and the low-side NMOS transistor 152 are not on at the same time, the NMOS transistors 202, 212 are not on at the same time as the PMOS transistors 222, 232, 242, 252 in the high voltage translator 280 and the NMOS transistors 310, 312, 314, 316 are not on at the same time as the PMOS transistors 302, 304, 306, 308 in the D2SE 260'.

Figure 4:
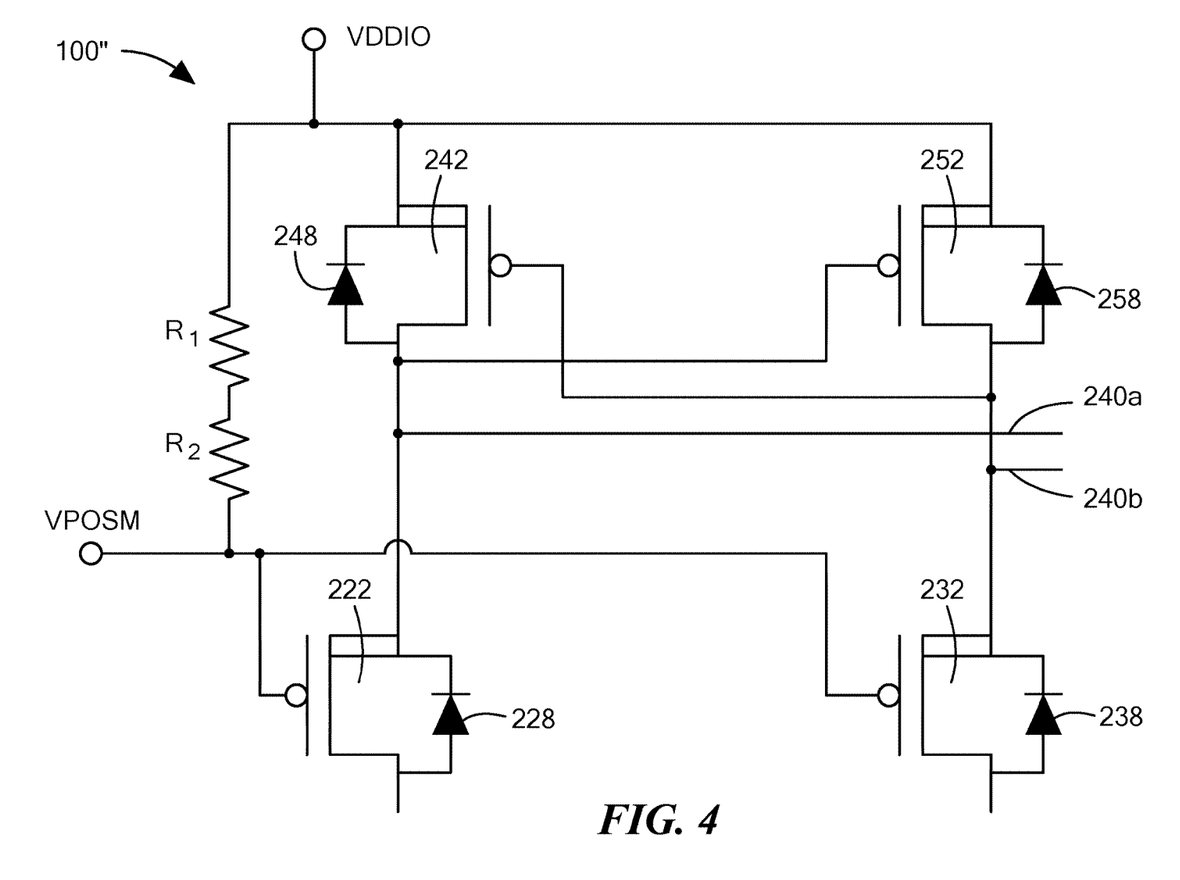
FIG. 4 is an abbreviated circuit diagram of a further example of the high voltage output driver of FIG. 1.

Referring to FIG. 4, another example of the abbreviated circuit 100' is the abbreviated circuit 100". The circuit 100" is the same as the circuit 100' except the circuit 100" includes one or more resistors between the first and second supply voltages. In this particular example, the one or more resistors are resistors $R_1$ and $R_2$. When powered off, the one or more resistors (e.g., $R_1$ and $R_2$), allows the second supply voltage, VPOSM, to eventually be the same voltage as the first supply voltage, VDDIO. The beneficial effect of this is that all the high voltages are put across the PMOS transistors 222, 232, and the low voltage PMOS transistors 242, 252 have a very small voltage across their source and drain (VDS) protecting them.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above. For example, while the regulator 100 of FIG. 1 is described as including both the feedforward path and associated circuitry described further in connection with FIGS. 2 and 3 and also as including the adaptive compensation controller 182 described further in connection with FIGS. 4 and 5, it will be appreciated that regulators may benefit from incorporation of either of these features individually as well.

Accordingly, it is submitted that that scope of the patent should not be limited to the described embodiments but rather should be limited only by the spirit and scope of the following claims.

What is claimed is:

1. A high voltage driver comprising:
   a high-side output transistor circuit;
   a differential to single-ended (D2SE) converter connected to a gate of the high-side output transistor circuit, wherein the D2SE is supplied by a first and a second supply voltage and is configured to receive a pair of differential input signals that are polarity-inverted versions of each other; and
   a high voltage translator connected to the D2SE converter, wherein the D2SE converter and the translator circuit are used to clamp a voltage at the gate of the high-side transistor circuit to be the first supply voltage less the second supply voltage.

2. The high voltage driver of claim 1, wherein the high-side output transistor circuit comprises a p-type device.

3. The high voltage driver of claim 2, wherein the p-type device comprises a p-channel DMOS high voltage (HV) transistor.

4. The high voltage driver of claim 2, wherein the p-type device comprises a PMOS transistor.

5. The high voltage driver of claim 1, wherein the high voltage translator comprises:
   an NMOS transistor pair configured to switch the high voltage translator;
   a first PMOS transistor pair configured to latch feedback signals from the NMOS transistor pair;
   a second PMOS transistor pair configured to clamp the voltage at the gate.

6. The high voltage driver of claim 5, wherein voltage at the gate is not reduced by a threshold voltage from the first PMOS transistor pair.

7. The high voltage driver of claim 1, further comprising a resistor disposed between the first and second supply voltage.

8. The high voltage driver of claim 1, wherein the D2SE converter comprises four PMOS transistors and four NMOS transistors.

9. The high voltage driver of claim 1, wherein a voltage difference between the pair of differential input signals swings between the first supply voltage and a diode threshold voltage greater than the second supply voltage.

10. An integrated circuit (IC), comprising:
    a high voltage driver comprising:
       a high-side output transistor circuit;
       a differential to single-ended (D2SE) converter connected to a gate of the high-side output transistor circuit, wherein the D2SE is supplied by a first and a second supply voltage and is configured to receive a pair of differential input signals that are polarity-inverted versions of each other; and a high voltage translator connected to the D2SE converter, wherein the D2SE converter and the translator circuit are used to clamp a voltage at the gate of the high-side transistor circuit to be the first supply voltage less the second supply voltage.

11. The IC of claim 10, wherein the high-side output transistor circuit comprises a p-type device.

12. The IC of claim 11, wherein the p-type device comprises a p-channel DMOS high voltage (HV) transistor.

13. The IC of claim 11, wherein the p-type device comprises a PMOS transistor.

14. The IC of claim 10, further comprising a resistor disposed between the first and second supply voltage.

15. The IC of claim 10, wherein the D2SE converter comprises four PMOS transistors and four NMOS transistors.

16. The IC of claim 10, wherein a voltage difference between the pair of differential input signals swings between the first supply voltage and a diode threshold voltage greater than the second supply voltage.

\* \* \* \* \*

UNITED STATES PATENT AND TRADEMARK OFFICE
CERTIFICATE OF CORRECTION

| | | |
|---|---|---|
| PATENT NO. | : 10,230,356 B2 | Page 1 of 1 |
| APPLICATION NO. | : 15/890563 | |
| DATED | : March 12, 2019 | |
| INVENTOR(S) | : Kenneth Snowdon | |

It is certified that error appears in the above-identified patent and that said Letters Patent is hereby corrected as shown below:

In the Specification

Column 2, Line 37, delete "herein allows" and replace with --herein allow--

Column 2, Line 42, delete "herein maximizes" and replace with --herein maximize--

Column 2, Line 46, delete "provides" and replace with --provide--

Column 2, Line 63, delete "received" and replace with --receives--

Column 3, Line 38, delete "a-diode" and replace with --a diode--

Column 4, Line 60, delete "a-diode" and replace with --a diode--

Column 4, Line 62, delete "a-diode" and replace with --a diode--

Column 5, Lines 10-11, delete "there is never" and replace with --there are never--

Column 6, Line 13, delete "that that scope" and replace with --that the scope--

In the Claims

Column 6, Lines 24-25, delete "version of" and replace with --versions of--

Signed and Sealed this
Twenty-first Day of May, 2019

Andrei Iancu
*Director of the United States Patent and Trademark Office*